(12) United States Patent
Paskover et al.

(10) Patent No.: US 11,815,347 B2
(45) Date of Patent: Nov. 14, 2023

(54) OPTICAL NEAR-FIELD METROLOGY

(71) Applicant: KLA-Tencor Corporation, Milpitas, CA (US)

(72) Inventors: Yuri Paskover, Caesarea (IL); Amnon Manassen, Haifa (IL); Vladimir Levinski, Migdal HaEmek (IL)

(73) Assignee: KLA-Tencor Corporation, Milpitas, CA (US)

( * ) Notice: Subject to any disclaimer, the term of this patent is extended or adjusted under 35 U.S.C. 154(b) by 676 days.

(21) Appl. No.: 15/599,881

(22) Filed: May 19, 2017

(65) Prior Publication Data

US 2018/0087900 A1    Mar. 29, 2018

Related U.S. Application Data

(60) Provisional application No. 62/400,627, filed on Sep. 28, 2016.

(51) Int. Cl.
*G03F 7/20* (2006.01)
*G01N 21/64* (2006.01)
(Continued)

(52) U.S. Cl.
CPC .......... *G01B 11/272* (2013.01); *G01B 11/303* (2013.01); *G01N 21/6489* (2013.01);
(Continued)

(58) Field of Classification Search
CPC .......... G10N 21/9501; G01N 21/6489; G01B 2210/56
(Continued)

(56) References Cited

U.S. PATENT DOCUMENTS 6,490,039 B2 * 12/2002 Maleki ................. G01N 21/552
356/436
6,901,101 B2 * 5/2005 Frick .................. G01D 5/35341
250/227.14
(Continued)

FOREIGN PATENT DOCUMENTS

CA         2104127 C      5/2001
CN       100550544 C     10/2009
(Continued)

OTHER PUBLICATIONS

Hopman, et al., Interactions with a photonic crystal micro-cavity using an AFM in contact or tapping mode operation, Proceedings Symposium IEEE/LEOS Benelux Chapter, pp. 25-28 Jan. 1, 2006.
(Continued)

*Primary Examiner* — David P Porta
*Assistant Examiner* — Carolyn Fin
(74) *Attorney, Agent, or Firm* — HODGSON RUSS LLP

(57) ABSTRACT

Systems and methods are provided which utilize optical microcavity probes to map wafer topography by near-field interactions therebetween in a manner which complies with high volume metrology requirements. The optical microcavity probes detect features on a wafer by shifts in an interference signal between reference radiation and near-field interactions of radiation in the microcavities and wafer features, such as device features and metrology target features. Various illumination and detection configurations provide quick and sensitive signals which are used to enhance optical metrology measurements with respect to their accuracy and sensitivity. The optical microcavity probes may be scanned at a controlled height and position with respect to the wafer and provide information concerning the spatial relations between device and target features.

19 Claims, 3 Drawing Sheets

(51) Int. Cl.
  *G01N 21/95* (2006.01)
  *G01B 11/27* (2006.01)
  *G03F 7/00* (2006.01)
  *G01B 11/30* (2006.01)

(52) U.S. Cl.
  CPC ..... *G01N 21/9501* (2013.01); *G03F 7/70633* (2013.01); *G01B 2210/56* (2013.01)

(58) Field of Classification Search
  USPC .............................. 250/459.1; 136/244, 243
  See application file for complete search history.

(56) References Cited

U.S. PATENT DOCUMENTS

| | | | |
|---|---|---|---|
| 7,218,803 | B1 | 5/2007 | Sumetsky |
| 7,498,564 | B2 * | 3/2009 | Miles ................... G01Q 60/22 250/234 |
| 8,116,624 | B1 * | 2/2012 | Wach ................... H04B 10/073 398/28 |
| 8,997,258 | B2 | 3/2015 | Aksyuk et al. |
| 2008/0231863 | A1 | 9/2008 | Chen et al. |
| 2009/0249521 | A1 | 10/2009 | Dazzi et al. |
| 2009/0274271 | A1 * | 11/2009 | Pfister ..................... A61B 6/12 378/62 |
| 2010/0085573 | A1 | 4/2010 | Lu et al. |
| 2011/0036171 | A1 | 2/2011 | Maris et al. |
| 2012/0250027 | A1 | 10/2012 | Zheng et al. |
| 2012/0268724 | A1 | 10/2012 | De Boer et al. |
| 2013/0169966 | A1 | 7/2013 | Shchegrov et al. |
| 2013/0321811 | A1 * | 12/2013 | Maeda ................... G01B 11/14 356/400 |
| 2014/0338074 | A1 | 11/2014 | Aksyuk et al. |
| 2015/0016943 | A1 * | 1/2015 | Hsieh ..................... H01L 22/20 414/816 |

FOREIGN PATENT DOCUMENTS

| | | |
|---|---|---|
| CN | 101924053 A | 12/2010 |
| CN | 103226296 A | 7/2013 |
| CN | 103245288 A | 8/2013 |
| CN | 104390596 A | 3/2015 |
| CN | 104620072 A | 5/2015 |
| EP | 0045321 A2 | 2/1982 |
| EP | 2496926 A1 | 9/2012 |
| EP | 2669739 A2 | 12/2013 |
| JP | H06102457 A | 4/1994 |
| JP | H1194859 A | 4/1999 |
| JP | 2003536059 A | 12/2003 |
| JP | 2014228323 A | 8/2014 |
| JP | 2016516194 A | 6/2016 |
| TW | 201435632 A | 9/2014 |
| WO | 2005019798 A2 | 3/2005 |
| WO | 2012164641 A | 12/2012 |

OTHER PUBLICATIONS

Hopman, et al., Nano-mechanical tuning and imaging of a photonic crystal micro-cavity resonance, Optics Express 8745, vol. 14, No. 19, 8 pages Sep. 18, 2006.
ISA/KR, International Search Report and Written Opinion for PCT/US2017/041404 dated Oct. 18, 2017.
Kuiper et al., "Large dynamic range Atomic Force Microscope for overlay improvements," Proceedings of Metrology, Inspection, and Process Control for Microlithography, 2016, pp. 1-10, vol. 9778, SPIE.
EPO, ESR for EP 17856951, Apr. 16, 2020.
Tang et al., "Study on Strain Detection of Si Basic Double Ring Cascade Optical Oscillation Cavity", Spectroscopy and Spectral Analysis, Mar. 31, 2016.
Chakravarty et al., "Slow light engineering for high Q high sensitivity Photonic crystal microcavity biosensors in silicon", Biosensors and Bioelectronics, pp. 170-176, vol. 38, Issue 1, Oct. 2012, ScienceDirect, USA.
Zhou et al., "Research on fully focused imaging algorithm and its calibration in phased array ultrasonic detection technology", Mechanical Engineering, May 31, 2015.
CNIPA, First Office Action for CN Application No. 201780054088.7, dated Jul. 24, 2020.
TIPO, Office Action for TW Application No. 106133381, dated Apr. 29, 2021.
JPO, Notice of Reasons for Refusal for JP Application No. 2019-537744, dated Jul. 30, 2021.
JPO, Office Action for JP Application No. 2019537744, dated Jan. 4, 2022.

* cited by examiner

OPTICAL NEAR-FIELD METROLOGY

CROSS REFERENCE TO RELATED APPLICATIONS

This application claims the benefit of U.S. Provisional Patent Application No. 62/400,627 filed on Sep. 28, 2016, which is incorporated herein by reference in its entirety.

BACKGROUND OF THE DISCLOSURE

1. Technical Field

The present disclosure relates to the field of optical metrology, and more particularly, to wafer feature scanning with high sensitivity and accuracy for enhancement of optical metrology.

2. Discussion of Related Art

Accuracy and sensitivity requirements in optical metrology keep rising with the advances in lithography production technologies and the reduction in integrated circuit (IC) device feature sizes. Current scanning technologies are too slow, too expensive and/or not accurate enough to provide required wafer topography inputs to the optical metrology systems.

SUMMARY OF THE DISCLOSURE

The following is a simplified summary providing an initial understanding of the disclosure. The summary does not necessarily identify key elements nor limit the scope of the disclosure, but merely serves as an introduction to the following description.

One aspect of the present disclosure provides a system comprising at least one optical microcavity sensor configured to detect features on a wafer, and a controller configured to measure distances between features of device and features of overlay targets by moving the at least one optical microcavity sensor therebetween.

These, additional, and/or other aspects and/or advantages of the present disclosure are set forth in the detailed description which follows; possibly inferable from the detailed description; and/or learnable by practice of the present disclosure.

BRIEF DESCRIPTION OF THE DRAWINGS

For a better understanding of embodiments of the disclosure and to show how the same may be carried into effect, reference will now be made, purely by way of example, to the accompanying drawings in which like numerals designate corresponding elements or sections throughout.

In the accompanying drawings.

DETAILED DESCRIPTION OF THE DISCLOSURE

Figure 1:
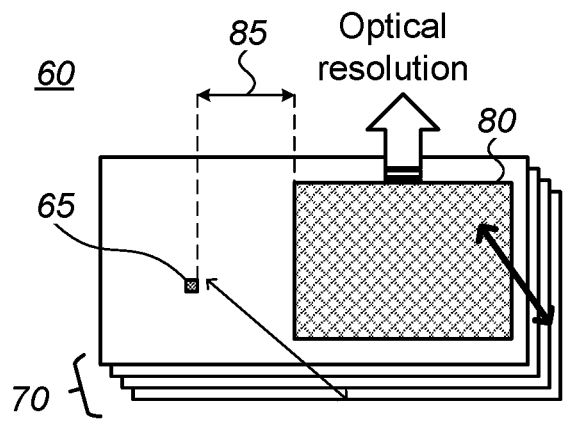
FIG. 1 is a high level schematic illustration of a section of a wafer having multiple layers that include features of devices and features of metrology target(s), according to some embodiments of the disclosure.

In the following description, various aspects of the present disclosure are described. For purposes of explanation, specific configurations and details are set forth in order to provide a thorough understanding of the present disclosure. However, it will also be apparent to one skilled in the art that the present disclosure may be practiced without the specific details presented herein. Furthermore, well known features may have been omitted or simplified in order not to obscure the present disclosure. With specific reference to the drawings, it is stressed that the particulars shown are by way of example and for purposes of illustrative discussion of the present disclosure only, and are presented in the cause of providing what is believed to be the most useful and readily understood description of the principles and conceptual aspects of the disclosure. In this regard, no attempt is made to show structural details of the disclosure in more detail than is necessary for a fundamental understanding of the disclosure, the description taken with the drawings making apparent to those skilled in the art how the several forms of the disclosure may be embodied in practice.

Before at least one embodiment of the disclosure is explained in detail, it is to be understood that the disclosure is not limited in its application to the details of construction and the arrangement of the components set forth in the following description or illustrated in the drawings. The disclosure is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing," "computing," "calculating," "determining," "enhancing," or the like, refer to the action and/or processes of a computer or computing system, or similar electronic computing device, that manipulates and/or transforms data represented as physical, such as electronic, quantities within the computing system's registers, and/or memories into other data similarly represented as physical quantities within the computing system's memories, registers or other such information storage, transmission, or display devices.

Systems and methods are provided which utilize optical microcavity probes to map wafer topography by near-field interactions therebetween in a manner which complies with high volume metrology requirements. The optical microcavity probes detect features on a wafer by shifts in an interference signal between reference radiation and near-field interactions of radiation in the microcavities and wafer features, such as device features and metrology target features. Various illumination and detection configurations provide quick and sensitive signals which are used to enhance optical metrology measurements with respect to their accuracy and sensitivity. The optical microcavity probes may be scanned at a controlled height and position with respect to the wafer and provide information concerning the spatial relations between device and target features.

FIG. 1 is a high level schematic illustration of a section of a wafer 60 having multiple layers 70 that include features 65 of devices and features 80 of metrology target(s), according to some embodiments of the disclosure. Metrology targets are generally designed to provide data at optical resolution concerning metrology parameters such as overlay between layers 70. These data are used as proxy for corresponding data concerning device features 65, which cannot be measured optically. Features 65, 80 may comprise any structure or element of corresponding IC devices and metrology targets, respectively (e.g., bars, trenches, or any other structural element). The two double headed arrows illustrate schematically that device features 65 and target features 80 appear in multiple layers of wafer 60.

Target features 65 typically suffer from pattern placement error which can be one of the most crucial parameters to be controlled during fabrication of Integrated Circuits (IC) in the semiconductor industry, as the relative positions of the features 65 affect both quality and yield of the final product. Typical patterning dimensions are too small for direct optical resolution, and thus special "proxy" targets are commonly fabricated in every lithography step, and the overlay (as a non-limiting example for a metrology parameter) between these larger "proxy" targets is monitored by various optical technologies.

However, the accuracy of the correspondence between placement data for device features 65 and target features 80 depends, among others, on (i) the assumption that the positions of features 80 of the metrology target(s) correctly represent the positions of features 65 of corresponding devices and therefore that the misplacements of features 80, 65 correspond; (ii) the assumption that a distance 85 (indicated schematically) between device features 65 and target features 80 does not introduce additional error; and (iii) the production accuracy of features 80 the metrology target(s) represent. These assumptions are becoming less accurate as the downscale of lithography reaches sub-10 nm dimensions. For example, overlay measurements may be unable to tolerate non-zero (e.g., few nm) offsets between features 80 of the overlay targets and features 65 of the actual IC components. As a result, precise calibration is required between placement errors of features 80, 65, which are designed at two different length-scales (e.g., 1-10 nm versus 100-1000 nm).

Figure 2:
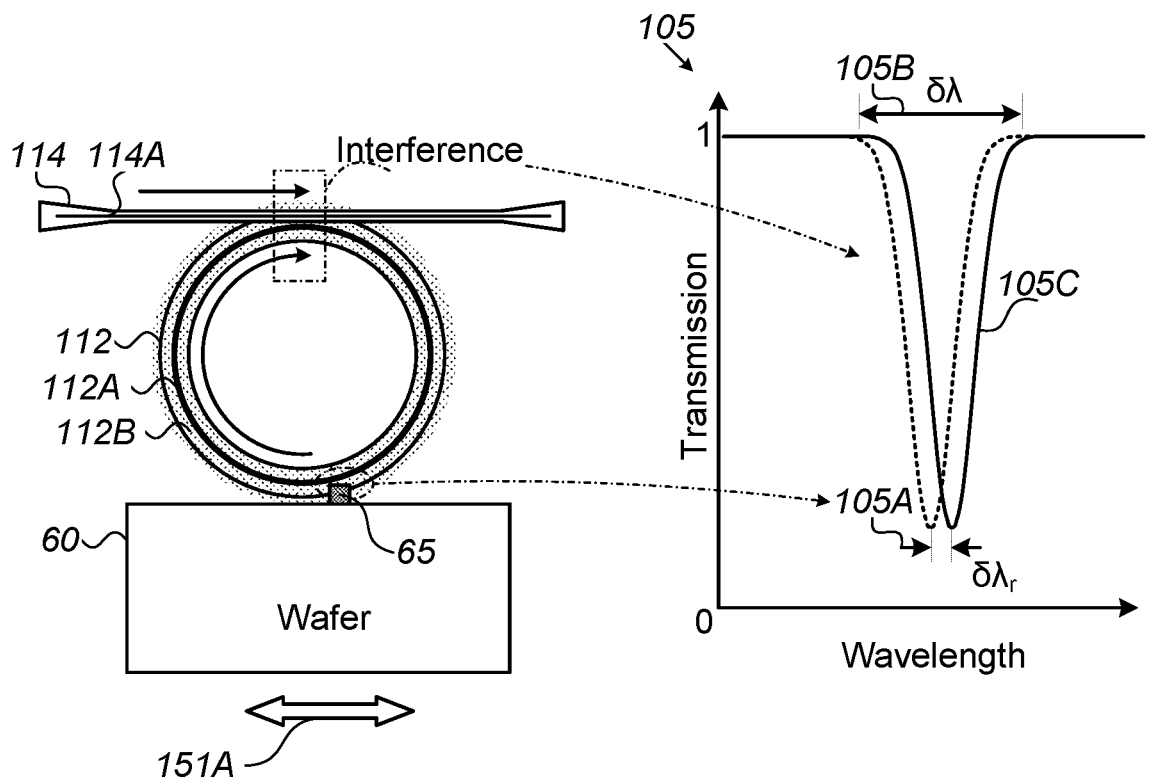
FIGS. 2 and 3 are high level schematic illustrations of a system configured to measure accurate relative positions of wafer features using optical microcavity sensor(s), according to some embodiments of the disclosure.
Figure 3:
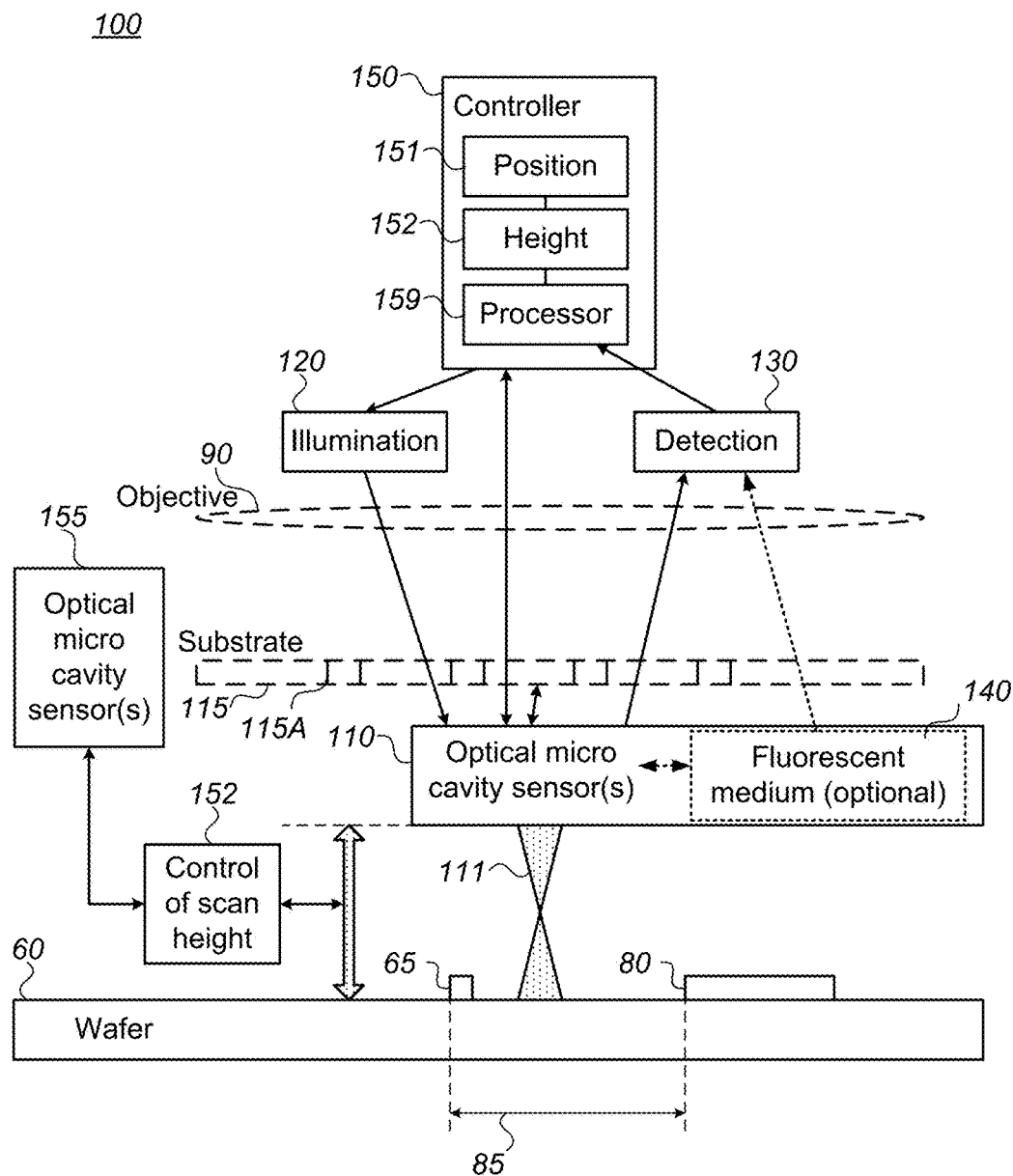

FIGS. 2 and 3 are high level schematic illustrations of a system 100 configured to measure accurate relative positions of wafer features 65, 80 using optical microcavity sensor(s) 110, according to some embodiments of the disclosure.

System 100 may comprise at least one optical microcavity sensor 110, comprising coupled microcavity 112 and fiber 114 (e.g., microcavity 112 may be coupled to tapered fiber 114), configured to detect features on wafer 60, and a controller 150 configured to measure distances 85 between features 65 of device and features 80 of overlay targets by moving at least one optical microcavity sensor 110 therebetween. For example, as microcavity sensor 110 is scanned (151A) above wafer 60, an evanescent part 112B of a cavity mode 112A may interact and cease to interact with on-wafer topography such as features 65, 80 during scanning 151A. Thus, the evanescent part of the cavity mode 112A may extend beyond the microcavity 112 but it does not propagate from the microcavity 112 to outside the microcavity 112, and its intensity decays exponentially with the distance from the microcavity 112. This electromagnetic field may have a small extant (e.g., for microcavities approximately 300 nm in diameter and distance decay length of approximately 100 nm). So if the microcavity 112 is scanned above wafer, the features having topography will get into the region of strong evanescent field and moving away from the microcavity 112 will exit this area (i.e., cease to interact). Microcavity 112 and/or microcavity sensor 110 may be configured thereby to provide radiation which is indicative of the interaction between an evanescent field of the microcavity 112 and the detected features. Cavity mode 112A can refer to the electromagnetic field within and/or around the microcavity 112.

The microcavity 112 may be coupled with the fiber 114 such that the fiber 114 is situated close enough to the microcavity 112 to provide the desired operation. The coupling can occur by tunneling of electromagnetic field between the two areas of high refractive index (e.g., the fiber 114 and microcavity 112).

In an instance, the microcavity 112 has total extant of approximately 10 μm×500 nm. The field (interaction area) is a series of spots with distance of approximately 330 nm and diameter of approximately 280 nm each. Other dimensions are possible. In this instance, the microcavity 112 is made of silicon and wavelength was 1550 nm. Light may be coupled into and from the microcavity 112.

Controller 150 may be further configured to carry out the distance measurements layer by layer on wafer 60 to provide accurate measurements of relative position between overlay targets and features 80 in a particular layer, and features 65 or parts of IC components fabricated in the same layer, and possibly to provide distance calibration for consecutive wafer layers or to provide corrections and enhance the accuracy of optical overlay measurements. For example, system 100 may be configured to provide calibration data concerning the production accuracy of features 80 of metrology target(s), which may then be used in the overlay algorithms to increase the metrology measurements accuracy.

Optical microcavities are optical resonators which have very narrow transmission (reflection) lines due to the micrometer or even nanometer dimensions of the microcavity (see example in graph 105). The ratio of an optical frequency ν to transmitted (reflected) bandwidth δ, termed quality factor $$Q = \frac{\nu}{\delta},$$

may reach values of $Q \cong 10^5\text{-}10^6$ which enables rapid scanning of the wafer surface. For example, using an optical frequency of $$\nu = \frac{c}{\lambda = 1550 \text{ nm}} = 194 \text{ THz}$$

provides $\delta \cong 200$ MHz which corresponds to a transmission bandwidth of $\delta\lambda \cong 1.55$ pm (105B).

The shift of the resonance line of microcavity 112 may be calculated using Equation 1, with $\delta\lambda_r$ (105A) denoting the shift of resonance frequency due to interaction of cavity 112 with IC or target components such as features 65 or 80, respectively; $\lambda_r$ denotes the resonance frequency of unperturbed cavity 112; $E_m(\vec{r})$ denotes the electric field of cavity mode 112; $\epsilon$ and $\delta\epsilon$ denote the electric permittivity and change difference between electric permittivity of IC or target component 65, 80 and the surrounding medium, respectively; $V_p$ denotes the interaction volume and V denotes the whole space.

$$\frac{\delta\lambda_r}{\lambda_r} = \frac{\int_{V_p} \delta\epsilon |E_m(\vec{r})|^2 dv}{\int_V \epsilon |E_m(\vec{r})|^2 dv} \qquad \text{Equation 1}$$

In order to assess the detectability of the frequency shift, it may be compared to transmission bandwidth, as expressed in Equation 2 (see the definition of Q above).

$$\frac{\delta\lambda_r}{\delta\lambda} = Q \times \frac{\int_{V_p} \delta \in |E_m(\vec{r})|^2 dV_p}{\int_V \in |E_m(\vec{r})|^2 dV} \quad \text{Equation 2}$$

For example, in simulations the sensitivity of $(\delta\lambda_r)/\delta\lambda$ was about 10% per nm of lateral scan (see illustration in graph 105), while the closest vertical distance of microcavity 112 to on-wafer topography which was simulated was 100 nm, indicating the high sensitivity of disclosed system 100 at reasonable non-limiting measurement conditions.

As illustrated schematically in FIGS. 2 and 3, optical microcavity sensor 110 may be used for scanning probe microscopy. Near field interaction of an evanescent part (indicated schematically by numeral 112B) of cavity modes (indicated schematically by numeral 112A) with features 65 and/or 80 on wafer 60 affects the resonance frequency in microcavity 112 of optical microcavity sensor 110 to change (105A) the interference wavelength between radiation 112A, B in microcavity 112 and radiation 114A in coupled fiber 114, as shown schematically in graph 105. A controller 150, e.g., via a position control module 151, may be configured to control a horizontal position (indicated schematically by an arrow 151A) of at least one optical microcavity sensor 110, to provide mapping of the topography at the current layer across wafer 60.

Advantageously, microcavity sensors 110 may be designed to have a confined intensity distribution by configuring a small mode volume, and further designed to store a significant part of the optical energy in evanescent waves 112B which may extend beyond the physical extent of sensor 110 (illustrated schematically in FIG. 2 with respect to microcavity 112) to provide enhanced sensitivity. These configurations may be adjusted to provide efficient interaction of microcavity 112 with its surroundings and provide high measurement resolution.

In certain embodiments, optical microcavities 112 of sensors 110 may be, as non-limiting examples, microtoroids, micro spheres, micro discs, 1D or 2D (one or two dimensional) photonic crystal cavities, nano-beam cavities, or any other configuration which yields high quality factors and tight confinement of the optical energy. For example, quality factor is used to measure the microcavities 112. In an instance, a high quality factor is Q>100 and tight confinement means less than $\lambda^3$.

Coupling mechanisms of microcavities 112 to fiber 114 may comprise, for example, direct (grating) coupling of cavity modes 112A to external laser field; coupling to tapered fiber 114; and/or evanescent coupling to a waveguide or a prism.

FIG. 3 illustrates schematically configurations of system 100, according to some embodiments of the disclosure. The illustrated elements may be employed singly or in various combinations with other elements.

Resonance shift detection (detection of $\delta\lambda_r$ 105A) 130 may be carried out in any of the following non-limiting examples. (i) Broadband illumination source 120 with spectrally sensitive detection 130 (e.g., using a high resolution spectrometer), which may provide immediate detection of line-shift, but might be limiting in terms of readout speed. (ii) Using a tunable light source illumination 120 with a photodetector may provide detection 130 of transmitted intensity as function of illumination wavelength at every scan point. (iii) Illumination 120 with a fixed narrow linewidth tuned to the transmission line slope (105C in FIG. 2) and detection 130 with a fast photodetector, to provide intensity detection at every scan point. Any of illumination sources 120 may, in some embodiments, be also controlled by controller 150, such as to tune the illumination provided thereby.

In certain embodiments, sensor 110 and/or microcavity 112 may be loaded with a broad-bandwidth fluorescent medium 140 which may be configured to enhance the sensitivity of sensor 110, provide a specified optical gain in a range covered by cavity resonance, and/or enhance the detectability of interactions between cavity 112 and features 65, 80. In certain embodiments, microcavity 112 may be configured as a high Q cavity loaded with fluorescent medium 140 and have a narrowband emission spectrum (similar to a laser, with corresponding optical gain). The interaction of disclosed microcavity 112 with on-wafer features 65, 80 may change the emitted spectrum via effective modification of resonant conditions of cavity 112.

For example, a laser can function by inclusion of fluorescent medium 140, such as indium phosphide, within a microcavity 112. The fluorescent medium 140 is excited by means of external energy supply (e.g., an electric current) and emits light. In general, fluorescent medium 140 can emit a broad spectrum, but once such emission happens in a microcavity 112, the emission will occur within the cavity mode and the wavelength will be defined by microcavity 112 geometry and properties (e.g., due to the Purcell effect). Perturbation of the microcavity 112 by interaction with on-wafer features will change resonance of the microcavity 112 and, thus, will change the emitted wavelength.

In certain embodiments, controller 150 may be further configured and/or comprise a height module 152 configured to control a vertical position of microcavity(ies) 112. Controller 150 and/or 152 may be further configured to maintain microcavity(ies) 112 at a specified scanning height. Multiple wafers 60 may be scanned by system 100, possibly at a fixed height above wafers 60, with controller 150 detecting and adjusting for wafer-to-wafer variations in optical and/or topographic properties, such as by comparing location-specific optical signals detected by sensor(s) 110 and/or sensor(s) 155. For example, the vertical position may be approximately 100 nm or less from the surface of the wafer 60, though other dimensions are possible.

In certain embodiments, system 100 may comprise at least one auxiliary optical microcavity sensor 155 configured to provide scanning height data to controller 150 and/or 152. Such configurations may extend the applications of sensor 110 to provide relative comparison between optical responses of different wafers while keeping scan height constant with the feedback from auxiliary optical microcavity sensor(s) 155 or other proximity sensors.

In certain embodiments, a microcavity signal 111 (illustrated schematically and denoted by numeral 111, e.g., corresponding to analysis results of graph 105) may be cross-registered with the optical metrology signals. For example, optical microcavities 112 and/or optical microcavity sensors 110 having typical sizes of 1-20 μm may be mounted on a transparent substrate 115 and introduced (e.g., as an entire scanning head) into the working distance between an optical objective 90 and wafer 60. In certain embodiments, transparent substrate 115 may further comprise printed registration marks 115A (shown schematically) for registering the optical metrology measurement with microcavity sensor(s) 100 and simultaneously collecting signal(s) 111 from microcavity sensor(s) 100 to further enhance metrology measurement accuracy.

Figure 4:
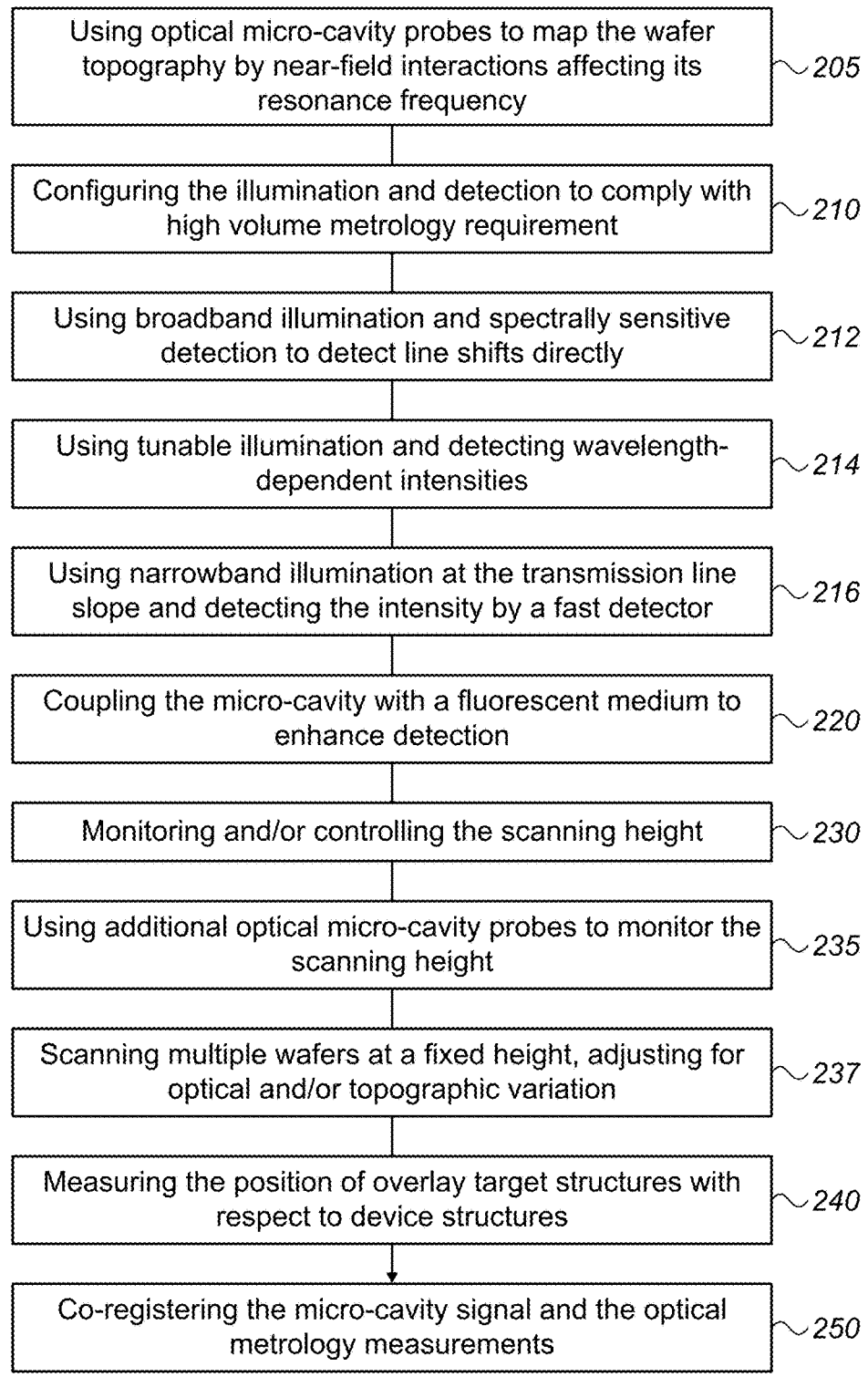
FIG. 4 is a high level flowchart illustrating a method, according to some embodiments of the disclosure.

FIG. 4 is a high level flowchart illustrating a method 200, according to some embodiments of the disclosure. The method stages may be carried out with respect to system 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. These method stages are described in more detail with respect to system 100 described above and optionally configured to implement method 200.

Method 200 may comprise using optical microcavity probes, such as microcavities 112 and/or microcavity sensors 110, to map the wafer topography by near-field interactions affecting resonance frequency (stage 205), and possibly configuring the illumination and detection to comply with high volume metrology requirements (stage 210). For example, the optical microcavity probes comprise microcavities coupled to respective fibers, and method 200 may further comprise configuring the microcavities to provide evanescent radiation extending beyond the respective cavities to interact with wafer features to provide interference with radiation in the fiber.

Method 200 may comprise any of using broadband illumination and spectrally sensitive detection to detect line shifts directly (stage 212), using tunable illumination and detecting wavelength dependent intensities (stage 214), and/or using narrowband illumination at the transmission line slope and detecting the intensity by a fast detector (stage 216).

Method 200 may comprise coupling the microcavity with a fluorescent medium to enhance detection (stage 220).

Method 200 may comprise monitoring and/or controlling the scanning height of the microcavity probes, such as the distance of the microcavity probes from the wafer structures (stage 230). In some embodiments, method 200 may comprise using additional optical microcavity probes to monitor the scanning height (stage 235). Method 200 may comprise further comprise scanning multiple wafers at a fixed height, adjusting for optical and/or topographic variation (stage 237).

Method 200 may comprise measuring the position of overlay target structures with respect to device structures (stage 240) and possibly co-registering the microcavity signal and the optical metrology measurements (stage 250).

Advantageously, disclosed systems 100 and methods 200 combine measurement speed and accuracy which are superior to previous methods, such as e-beam imaging, electron microscopy or scanning probe methods (atomic force microscopy, AFM). Moreover, disclosed systems 100 and methods 200 are less prone to errors resulting from local charge which attenuates electrons, distorts the images of electron-based previous imaging systems, and consequently may exhibit significant positioning errors. Finally, disclosed systems 100 and methods 200 require less 3D positioning accuracy than AFM-based methods and are not limited by cantilever oscillation frequency of the AFM which causes long measurements durations (e.g., for cantilever oscillation frequencies between 10-100 kHz, scanning a 1 $\mu m^2$ area with resolution of $nm^2$ is approximately 100 sec), that are unacceptable for high volume manufacturing (HVM).

Advantageously, using optical microcavity(ies) as a scanning head for IC circuits enables fast non-contact scanning (e.g., at distances, or heights in the order of magnitude of 100 nm), utilizing the fast response of the resonator to reduce the scan time with respect to the prior art by up to eight orders of magnitude. Moreover, systems 100 and methods 200 may be limited only by detector speeds rather than by the oscillator frequency. Initial simulations suggest that disclosed systems 100 and methods 200 may improve the accuracy of overlay measurements and provide overlay measurements which are more robust with respect to process variations. Moreover, disclosed systems 100 and methods 200 enable utilization of scanning probe microscopy for cross registration of IC components to overlay targets and integration of optical microcavity sensing in the scanning head for overlay metrology and possibly also for proximity sensing for feedback on the scanning height.

Embodiments disclosed herein can provide quick and sensitive signals which are used to enhance optical metrology measurements with respect to their accuracy and sensitivity. For example, scan time can be defined by the time it takes to measure every point multiplied by the number of points to measure because the measurement may be performed point by point. Time to measure a point can be estimated as cavity response time, which is evaluated as approximately optical oscillation time multiplied by a mean number of oscillations it takes for a photon to leave the cavity. This number is called Q-factor, and can be as high as $Q \approx 10^6$. Oscillation time is $$\tau_{opt} = \frac{\lambda}{c} = \frac{1.5 \times 10^{-6} \text{ m}}{3 \times 10^8 \frac{\text{m}}{\text{s}}} = 5 \times 10^{-15} \text{ s}.$$

t [per point]=$t_{opt} \times Q$=5 nsec. To measure a target with dimensions of 1 μm×1 μm with resolution of 1 nm×1 nm, it may make it 1 million points, so total nominal measurement time will be approximately 5 millisecond. Such an estimation does not take into account any mechanical overhead.

Aspects of the present disclosure are described above with reference to flowchart illustrations and/or portion diagrams of methods, apparatus (systems), and computer program products according to embodiments of the disclosure. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present disclosure. In this regard, each portion in the flowchart or portion diagrams may represent a module, segment, or portion of code, which comprises one or more executable instructions for implementing the specified logical function (s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the disclosure. The various appearances of "one embodiment," "an embodiment," "certain embodiments," or "some embodiments" do not necessarily all refer to the same embodiments. Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Certain embodiments of the disclosure may include features from different embodiments disclosed above, and certain embodiments may incorporate elements from other embodiments disclosed above. The disclosure of elements of the disclosure in the context of a specific embodiment is not to be taken as limiting their use in the specific embodiment alone. Furthermore, it is to be understood that the disclosure can be carried out or practiced in various ways and that the disclosure can be implemented in certain embodiments other than the ones outlined in the description above.

The disclosure is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the disclosure belongs, unless otherwise defined. While the disclosure has been described with respect to a limited number of embodiments, these should not be construed as limitations on the scope of the disclosure, but rather as exemplifications of some of the preferred embodiments. Other possible variations, modifications, and applications are also within the scope of the disclosure. Accordingly, the scope of the disclosure should not be limited by what has thus far been described, but by the appended claims and their legal equivalents.

What is claimed is:

1. A system comprising:
at least one optical microcavity sensor configured to detect features of a device on a wafer, wherein the at least one optical microcavity sensor is mounted on a transparent substrate, and wherein the transparent substrate further comprises registration marks for registering optical metrology measurements with microcavity measurements, and
a controller configured to measure distances between the features of the device on the wafer and features of overlay targets based on shifts in an interference signal between reference radiation and near-field interactions as the at least one optical microcavity sensor moves between the features of the device and the features of the overlay targets, wherein the shifts in the interference signal are determined using a shift of resonance frequency due to interaction of a microcavity in the microcavity sensor and a resonance frequency when the microcavity is unperturbed.

2. The system of claim 1, wherein the at least one optical microcavity sensor comprises at least one of the microcavity configured to provide evanescent radiation extending beyond the at least one microcavity, and wherein the at least one microcavity is further configured to provide radiation which is indicative of interaction between an evanescent field of the at least one microcavity and the detected features.

3. The system of claim 2, wherein the at least one microcavity is configured to yield a high quality factor greater than 100 and a confinement of optical energy less than a cube of a wavelength emitted by the microcavity in the at least one microcavity.

4. The system of claim 3, wherein the at least one microcavity is formed as a micro-toroid, a micro sphere, a micro disc, or a 1D or 2D (one or two dimensional) photonic crystal cavity.

5. The system of claim 1, wherein the controller is further configured to control a horizontal position of the at least one optical microcavity sensor.

6. The system of claim 1, wherein the controller is further configured to control a vertical position of the at least one optical microcavity sensor.

7. The system of claim 6, wherein the controller is further configured to maintain the at least one optical microcavity sensor at a specified scanning height.

8. The system of claim 6, further comprising at least one auxiliary optical microcavity sensor configured to provide scanning height data to the controller.

9. The system of claim 1, wherein the at least one optical microcavity sensor is loaded with a broad-bandwidth fluorescent medium selected to provide a specified optical gain in a range covered by microcavity resonance.

10. A method comprising:
mapping a wafer topography across a wafer by scanning optical microcavity probes across the wafer and using near-field interactions between the optical microcavity probes and the wafer, wherein the optical microcavity probes are mounted on a transparent substrate, and wherein the transparent substrate further comprises registration marks for registering optical metrology measurements with microcavity measurements,
illuminating the optical microcavity probes, and
detecting shifts in an interference signal between reference radiation and the near-field interactions using the optical microcavity probes.

11. The method of claim 10, further comprising directly detecting line shifts sensed by the optical microcavity probes using broadband illumination and spectrally sensitive detection.

12. The method of claim 10, further comprising detecting wavelength-dependent intensities of signals from the optical microcavity probes using a tunable light source.

13. The method of claim 10, wherein the illuminating is narrowband illumination, and further comprising detecting a signal intensity from the optical microcavity probes by a fast detector using the narrowband illumination at a transmission line slope of the optical microcavity probes.

14. The method of claim 10, further comprising coupling the optical microcavity probes with a fluorescent medium.

15. The method of claim 10, wherein the optical microcavity probes comprise microcavities coupled to fibers, the method further comprising providing evanescent radiation extending beyond the microcavities to interact with wafer features.

16. The method of claim 10, further comprising controlling a scanning height of the optical microcavity probes.

17. The method of claim 16, further comprising scanning multiple wafers at a fixed scanning height thereby adjusting for optical and/or topographic variation of the wafers.

18. The method of claim 10, further comprising measuring a position of overlay target structures with respect to device structures in the wafer topography based on the shifts in the interference signal between the reference radiation and the near-field interactions as at least one of the optical microcavity probes moves between the device structures and the overlay target structures, wherein the shifts in the interference signal are determined using a shift of resonance frequency due to interaction of a microcavity in the optical microcavity probes and a resonance frequency when the microcavity is unperturbed.

19. The method of claim 18, further comprising:
performing the optical metrology measurements of the wafer topography; and
co-registering signals from the optical microcavity probes and the optical metrology measurements.

* * * * *